United States Patent
Nishijima et al.

(10) Patent No.: US 8,350,147 B2
(45) Date of Patent: Jan. 8, 2013

(54) PROCESS FOR PRODUCING ENCAPSULATING MATERIAL FOR SOLAR CELL

(75) Inventors: Koichi Nishijima, Ichihara (JP); Manabu Kawamoto, Tokyo (JP); Rie Sato, Tokyo (JP); Tetsuya Nakamura, Tokyo (JP)

(73) Assignee: Du Pont-Mitsui Polychemicals Co., Ltd., Minato-Ku, Tokyo (JP)

( * ) Notice: Subject to any disclaimer, the term of this patent is extended or adjusted under 35 U.S.C. 154(b) by 126 days.

(21) Appl. No.: 11/884,050

(22) PCT Filed: Feb. 10, 2006

(86) PCT No.: PCT/JP2006/302322
§ 371 (c)(1),
(2), (4) Date: Feb. 8, 2008

(87) PCT Pub. No.: WO2006/085603
PCT Pub. Date: Aug. 17, 2006

(65) Prior Publication Data
US 2009/0023867 A1     Jan. 22, 2009

(30) Foreign Application Priority Data

Feb. 10, 2005 (JP) ................. 2005-034913
Apr. 26, 2005 (JP) ................. 2005-128662

(51) Int. Cl.
*H01L 31/0203* (2006.01)

(52) U.S. Cl. ........ 136/256; 264/236; 264/340; 264/232; 264/347; 525/387; 525/333.7

(58) Field of Classification Search ............. 525/387, 525/333.7; 264/340, 232, 347, 236
See application file for complete search history.

(56) References Cited

U.S. PATENT DOCUMENTS

| | | | | |
|---|---|---|---|---|
| 4,138,462 A | * | 2/1979 | Procida et al. | 264/347 |
| 5,684,325 A | * | 11/1997 | Kataoka et al. | 257/433 |
| 2004/0082722 A1 | * | 4/2004 | McLeod et al. | 525/192 |

FOREIGN PATENT DOCUMENTS

| | | | |
|---|---|---|---|
| JP | 58-023870 | | 2/1983 |
| JP | 59-138234 | * | 8/1984 |
| JP | 59-138234 A | | 8/1984 |
| JP | 2-40709 B2 | | 9/1990 |
| JP | 11-26791 | * | 1/1999 |
| JP | 11-026791 A | | 1/1999 |
| JP | 11-026791 A | * | 1/1999 |

OTHER PUBLICATIONS

Definition of Diffusion, Hawley's Condensed Chemical Dictionary, 14th Edition, 2002.*

* cited by examiner

*Primary Examiner* — Robert C Boyle
(74) *Attorney, Agent, or Firm* — Buchanan Ingersoll & Rooney PC

(57) ABSTRACT

The present invention provides a process for producing an encapsulating material for solar cell which makes high-speed crosslinking possible and causes no blister phenomenon without significant restrictions being imposed on the conditions for molding the encapsulating material.

The present invention provides a process for producing the encapsulating material for solar cell including impregnating a molded form of an ethylene copolymer with an organic peroxide in a liquid state at normal temperature which shows a decomposition temperature (a temperature at which the half-life period is one hour) of not higher than 150° C.

A process for producing the encapsulating material for solar cell in which dialkyl peroxide (A) and an organic peroxide (B) selected from peroxycarbonate and peroxyketal at a ratio by weight of 10/90 to 90/10 of (A) and (B) in a liquid state impregnate the molded form of the ethylene copolymer is a preferable embodiment of the present invention.

6 Claims, No Drawings

PROCESS FOR PRODUCING ENCAPSULATING MATERIAL FOR SOLAR CELL

TECHNICAL FIELD

The present invention relates to a process for producing industrially favorably an encapsulating material for solar cell which makes high-speed crosslinking possible and causes no blister phenomenon during the solar cell encapsulation process.

BACKGROUND ART

Under a background of the growing environmental problems in recent years, hydroelectric power generation, wind power generation and photovoltaic power generation are getting into the limelight as clean energy. Out of these, the spread of photovoltaic power generation has been making remarkable progress in recent years as the performance of solar cell modules in power generation efficiency and other respects has been making marked improvements while on the other hand their prices have been falling and the national and local governments have been promoting the business of introducing photovoltaic power generation systems for household use. Under a backdrop of such expansion of the solar cell market, there is a growing demand for higher productivity in the manufacture of solar cell modules.

A solar cell module is generally a package formed by protecting a solar cell element comprising such materials as silicon, gallium-arsenic and copper-indium-selenium with a top transparent protective material and a bottom protective substrate material, with the solar cell element and the protective materials fixed by use of an encapsulating material. Generally, the encapsulating material for the solar cell element in a solar cell module is formed by extruding a sheet from an ethylene-vinyl acetate copolymer to which an organic peroxide and silane coupling agent have been compounded. The encapsulating material in the form of sheet thus obtained is used to encapsulate the solar cell element to produce a solar cell module. In this method, it is necessary at the stage of the production of an encapsulating material in the form of sheet to form the encapsulating material at such low temperature that the organic peroxide will not be decomposed, and therefore it is impossible to increase the speed of extrusion. In this method, it is also necessary at the stage of encapsulating the solar cell element to go through a two-step crosslinking and bonding process which comprises the step of carrying out preliminary bonding on a laminator in several minutes to several tens of minutes and the step of carrying out final bonding in an oven in several tens of minutes to one hour at a high temperature at which the organic peroxide is decomposed (Patent Reference 1).

As a means for improving productivity in the production of solar cell modules as described above, use of an organic peroxide showing a low decomposition temperature is conceived to increase crosslinking speed and thereby to shorten the time required for crosslinking and bonding. On the other hand, use of an organic peroxide showing a low decomposition temperature has a shortcoming that such use necessitates lower processing temperature in the sheet extrusion mentioned above to prevent the decomposition of the organic peroxide, and it causes a decline in lower productivity. To improve this shortcoming, a method for producing an encapsulating material by a method in which a sheet of ethylene copolymer is prepared by extrusion in advance and an organic peroxide in a liquid state impregnates the resultant sheet has already been proposed (Patent Reference 2). Specifically in this proposal, an example is given in which an organic peroxide is coated onto a sheet, and the sheet is subjected to crosslinking treatment when its surface has become dry. However, with such example, there is a possibility that the organic peroxide will not be dispersed adequately in the sheet and a uniformly crosslinked sheet will not be obtained. Another shortcoming of the use of an organic peroxide showing a low decomposition temperature is that a blister phenomenon of the sheet takes place due apparently to the decomposition gas emitted as a result of the decomposition of the organic peroxide.

On the other hand, a formulation of an ethylene copolymer to which a particular organic peroxide mixture has been compounded is already been known as a compound which meets both of the requirements for the high-speed crosslinking of the ethylene copolymer and the prevention of a blister phenomenon mentioned above (Patent Reference 3). Specifically, this proposal discloses only the conventional solar cell encapsulating material manufacturing method in which a sheet is molded after an organic peroxide is compounded to an ethylene copolymer. Therefore, in this specific example, the conditions for molding an encapsulating material in the form of sheet are restricted, and it is difficult to achieve an adequate improvement in productivity.

Reference 1: Japanese Patent Publication HEI 2-40709
Reference 2: Japanese Laid-open Patent Application SHO 59-138234
Reference 3: Japanese Laid-open Patent Application HEI 11-26791

DISCLOSURE OF THE INVENTION

Problems to be Solved by the Invention

An object of the present invention is to provide a method for manufacturing solar cell encapsulating materials which makes high-speed crosslinking possible and causes no blister phenomenon in which no significant restrictions being imposed on the conditions for molding the encapsulating material. Another object of the present invention is to provide a method for manufacturing solar cell encapsulating materials of uniform quality effectively.

Means to Solve the Problems

The present invention provides a process for producing a encapsulating material for solar cell including impregnating a molded form of an ethylene copolymer with an organic peroxide in a liquid state at normal temperature which shows a decomposition temperature (a temperature at which the half-life period is one hour) of not higher than 150° C.

The present invention provides, as a preferable embodiment of the present invention, a process for producing an encapsulating material for solar cell in which a molded form of the aforementioned ethylene copolymer is a molded form of an ethylene copolymer containing a crosslinking aid.

The present invention provides, as a preferable embodiment of the present invention, a process for producing the encapsulating material for solar cell in which the aforementioned molded form of an ethylene copolymer is a molded form of an ethylene copolymer not containing any crosslinking aid.

The present invention provides as a preferable embodiment of the present invention a process for producing the encapsulating material for solar cell in which a mixture of the aforementioned organic peroxide and a crosslinking aid blended at a ratio by weight of 1/0.1 to 0.1/1 is impregnated into the aforementioned molded form of an ethylene copolymer.

A process for producing the encapsulating material for solar cell in which two or more kinds of peroxides having different decomposition temperatures are used for the organic peroxide is a preferably embodiment of the present invention.

A process for producing the encapsulating material for solar cell in which dialkyl peroxide (A) and an organic peroxide (B) selected from peroxycarbonate and peroxyketal at a ratio by weight of 10/90 to 90/10 of (A) and (B) in a liquid state is impregnated into the molded form of an ethylene copolymer is a preferably embodiment of the present invention.

A process for producing the encapsulating material for solar cell in which the surface of the molded form of an ethylene copolymer is coated or sprayed with the aforementioned organic peroxide and the organic peroxide is impregnated into the molded form is a preferably embodiment of the present invention.

A process for producing the encapsulating material for solar cell in which the organic peroxide is impregnated into the molded form and then the form is left for ageing for at least one day or more is a preferably embodiment of the present invention.

Effects of the Invention

According to the present invention, a broad range of temperature can be selected in the molding of encapsulating materials. This makes it possible both to increase molding speed and to conduct precise molding. In addition, since injection molding and press molding as well as extrusion molding are possible with the present invention, it is possible to apply the present invention to the manufacture of encapsulating materials not only in the form of sheet but also in a complex shape. Furthermore, since high-speed crosslinking is possible even in the case of using an organic peroxide showing a relatively high decomposition temperature, the present invention makes it easy to prevent the blistering of the encapsulating material during crosslinking and makes it possible to form an encapsulation layer having a high percent gel content. Moreover, in the case of using two kinds of peroxides having different decomposition temperatures, it is possible to further increase crosslinking speed and suppress a blister phenomenon by setting their blending ratio within an appropriate range. Further, since a blister phenomenon can be suppressed all the more without high-speed crosslinkability being impaired too much even if crosslinking temperature is lowered, the present invention is applicable satisfactorily to the production of those solar cell modules using plastic protective materials which are influenced with temperature easily.

Best Embodiments of the Invention

The present invention provides the process for producing the encapsulating material for solar cell comprising impregnating the molded form of the ethylene copolymer with the organic peroxide in a liquid state at normal temperature which shows a decomposition temperature (a temperature at which the half-life period is one hour) of not higher than 150° C.

In producing the encapsulating material according to the present invention, a molded form of an ethylene copolymer which has an required shape is used. As examples of the aforementioned ethylene copolymer, one or two or more kinds of copolymers selected from between copolymer of ethylene and polar monomer and copolymer of ethylene and α-olefin having not less than 3 carbon atoms can be cited. Out of these, a copolymer of ethylene and polar monomer is preferably used in view of transparency and adhesion to the protective material and the solar cell element, among other properties. As specific examples of a polar monomer of ethylene/polar monomer copolymer, vinyl ester such as vinyl acetate and vinyl propionate; unsaturated carboxylic acid ester such as methyl acrylate, ethyl acrylate, isopropyl acrylate, isobutyl acrylate, n-butyl acrylate, isooctyl acrylate, methyl methacrylate, isobutyl methacrylate and dimethyl maleate, etc.; unsaturated carboxylic acid such as acrylic acid, methacrylic acid, fumaric acid, itaconic acid, maleic acid monomethyl, maleic acid monoethyl, maleic acid anhydride and itaconic acid anhydride, etc., salt of these unsaturated carboxylic acid, one or two kind or more of carbon monoxide and sulfur dioxide, etc. can be exemplified. As salt of unsaturated carboxylic acid, salt of mono-valent metal such as lithium, sodium and potassium; salt of polyvalent metal such as magnesium, calcium and zinc can be cited.

In addition, above ethylene and copolymers of α-olefin having three or more carbon, preferably 3 to 20 of carbon, more preferably 3 to 8 are cited. As preferable example of α-olefin, propylene, 1-butene, 1-hexene, 1-octane and 4-methyl-1-pentene etc. can be cited.

As the aforementioned ethylene/polar monomer copolymer, an ethylene/polar monomer copolymer having an ethylene unit content of 60 to 85 wt %, particularly 65 to 80 wt %, is preferably used in view of transparency, flexibility, anti-block properties and organic peroxide impregnation properties, etc. As the ethylene/polar monomer copolymer, an ethylene/polar monomer copolymer showing a melt flow rate (based on JIS K7210-1999; this definition applies hereinafter) of 0.1 to 100 g/10 min., particularly 0.5 to 50 g/10 min. at 190° C. under a load of 2,160 g is also preferably used in view of moldability, mechanical properties, etc.

More specifically, as preferable ethylene/polar monomer copolymers, representative examples include ethylene vinyl ester copolymer such as ethylene/vinyl acetate copolymer; ethylene/unsaturated carboxylic acid ester copolymer such as ethylene/methyl acrylate copolymer, ethylene/ethyl acrylate copolymer, ethylene/methyl methacrylate copolymer, ethylene/isobutyl acrylate copolymer and ethylene/n-butyl acrylate copolymer; ethylene/unsaturated carboxylic acid copolymer such as ethylene/acrylic acid copolymer, ethylene/methacrylic acid copolymer, ethylene/isobutyl acrylate/methacrylic acid copolymer and their ionomers.

Out of these, ethylene-vinyl acetate copolymer, ethylene-acrylic acid ester copolymer and ethylene-acrylic acid ester-(metha)acylic acid copolymer are used preferably in view of applicability to the required physical properties of the encapsulating material for solar cell such as moldability, transparency, flexibility, adhesion and light stability and organic peroxide impregnation properties; and in particular, ethylene-vinyl acetate copolymer is preferably used.

As a ethylene-α-olefin copolymer that is another example of the ethylene copolymer, the ethylene-α-olefin copolymer having an ethylene polymerization unit of 70 to 85 mol %, a 30 to 15 mol % content of the α-olefin polymerization unit other than ethylene, and as required a diene monomer polymerization unit of not higher than 2 mol %, preferably not higher than 1 mol %, can be cited. Examples of such ethylene copolymer include ethylene-propylene copolymer, ethylene-1-butene copolymer, ethylene-4-methyl-1-pentene copolymer, ethylene-1-hexene copolymer, ethylene-1-octene copolymer, ethylene-propylene-dicyclopentadiene copolymer, ethylene-propylene-5-ethylidene-2-norbornene copolymer and ethylene-propylene-1,6-hexadiene copolymer. As the ethylene-α-olefin copolymer, an ethylene-α-olefin copolymer showing a melt flow rate of 0.1 to 100 g/10 min., particularly 0.5 to 50 g/10 min. at 190° C. under a load of 2,160 g is also preferably used in view of moldability and mechanical properties, etc.

The present invention provides a process for producing the encapsulating material, which includes impregnating a molded form in a desired shape comprising above ethylene copolymer with an organic peroxide of a liquid state.

This method makes it possible to avoid a loss of the organic peroxide and obtain an encapsulating material layer having high gel content after it is hardened.

The molded form of the ethylene copolymer may be a molded form to which no crosslinking aid has been compounded or a molded form to which a crosslinking aid has been compounded.

According to the present invention, it is possible to produce the encapsulating material for solar cell by impregnating the molded form of ethylene copolymer with the organic peroxide in a liquid state at normal temperature which shows a decomposition temperature (a temperature at which the half-life period is one hour) of not higher than 150° C. Since the use of a crosslinking aid accelerates crosslinking, the use of a crosslinking aid is a preferable embodiment of the present invention. In the case of using a crosslinking aid, it may be compounded into a molded form of the ethylene copolymer prior to use, or it may be impregnated into the aforementioned molded form. Furthermore, a crosslinking aid may be impregnated into a molded form of the ethylene copolymer to which a crosslinking aid has been compounded.

A method for producing a solar cell encapsulating material by impregnating a molded form of an ethylene copolymer containing a crosslinking aid with an organic peroxide in a liquid state at normal temperature which shows a decomposition temperature (a temperature at which the half-life period is one hour) of not higher than 150° C. is a preferable embodiment of the present invention.

Furthermore, a method for producing a solar cell encapsulating material by impregnating a molded form of an ethylene copolymer containing no crosslinking aid with an organic peroxide in a liquid state at normal temperature which shows a decomposition temperature (a temperature at which the half-life period is one hour) of not higher than 150° C. is another preferable embodiment of the present invention.

In the present invention, a mixture of the aforementioned organic peroxide and a crosslinking aid can be impregnated into the molded form of ethylene copolymer as a means that both of them impregnate into the molded form. In using a method in which a mixture of the organic peroxide and a crosslinking aid is impregnated into the molded form, the ratio between the organic peroxide in a liquid state and the crosslinking aid is preferably 1/0.1 to 0.1/1 by weight.

As the molded form, a sheet 0.1 to 1 mm in thickness is normally used. However, needless to say, it is possible to use a molded form in a shape other than a sheet to match the shape of a solar cell module. A molded form in the shape of sheet can be produced by a sheet molding method known to the public which uses a T-die extruder, calendering and other equipment. Additives as mentioned below such as silane coupling agents, UV absorbers, antioxidants and light stabilizers may be added to such molded form in advance as required.

As a crosslinking aid compounded into above ethylene copolymer, poly unsaturated compound such as polyallyl compound and poly (meta) acryloxy compound can be exemplified. More specific examples can include polyallyl compound such as triallylisocyanurate, triallylcyanurate, diallylphthalate, diallylfumarate, diallylmaliate; poly (meta) acryloxy compound such as ethyleneglycol diacrylate, ethyleneglycol dimethacrylate trimethylolpropanetri methacrylate and divinylbenzene.

It is effective to use crosslinking aid in a ratio of approximate 0.5 to 5 part by weight to 100 part by weight of ethylene polymer.

As the organic peroxide to be impregnated into the aforementioned molded form, an organic peroxide which is in a liquid state at normal temperature and shows a decomposition temperature (a temperature at which the half-life period is one hour) of not higher than 150° C. can be used. As organic peroxide, dialkyl peroxide such as tertiary butyl cumyl peroxide (142° C.), dicumylperoxide (135° C.), 2,5-dimethyl-2,5-bis (tertiary butyl peroxy) hexane (140° C.), 2,5-dimethyl-2,5-bis (tertiary butyl peroxy)hexine-3,1,3-bis (2-tertiary butyl peroxy isopropyl) benzene (137° C.), di tertiary butyl peroxide (149° C.); alkyl peroxyl ester such as tertiary butyl peroxyl isobutylate (102° C.), tertiary butyl peroxyl maleic acid (110° C.), tertiary butyl peroxy isonanoate (123° C.), tertiary butyl peroxy isopropyl carbonate (119° C.), tertiary butyl peroxy-2-ethyl hexyl carbonate (121° C.), tertiary butyl peroxyl acetate (123° C.), tertiary butyl peroxy benzoate (125° C.), 2,5-dimethyl-2,5-bis (benzoyl peroxy) hexane (118° C.), 2,5-dimethyl hexyl-2,5-bis peroxy benzoate; peroxyl ketal such as 1,1-bis (tertiary butyl peroxy)-3,3,5-trimethyl cyclohexane (112° C.), 1,1-bis (tertiary butyl peroxy) cyclohexane (112° C.), 1,1-bis (tertiary amyl peroxy) cyclohexane (112° C.), 2,2-bis (tertiary butyl peroxy) butane (112° C.), n-butyl-4,4-bis (tertiary butyl peroxy) valarate (129° C.), ethyl-3,3-bis (tertiary butyl peroxy) butylate (135° C.) can be exemplified (the temperature in each parenthesis is one at which the half-life period is one hour). Out of these, taking into consideration of readiness for impregnation to molded forms of ethylene copolymer, it is preferable to be in a liquid state at normal temperature. The organic peroxide may be used singly or in combination with two or more kinds of organic peroxide. When the organic peroxide is used in combination with two or more kinds of organic peroxide, the mixture which is in a liquid state at normal temperature is preferable.

In the present invention, the organic peroxide which is in a liquid state at normal temperature includes not only an organic peroxide which is in a liquid state at normal temperature by itself but also an organic peroxide which is in a liquid state when mixed with one or more other organic peroxides.

As the aforementioned dialkyl peroxide, dialkyl peroxide which shows a decomposition temperature (a temperature at which the half-life period is one hour) of 130 to 150° C., preferably 135 to 150° C., is preferably used in view of the balance between the high-speed crosslinking of the solar cell encapsulating material and the effect in preventing blister at the time of crosslinking. Furthermore, as the aforementioned alkyl peroxyester or peroxy ketal, an organic peroxide which shows a decomposition temperature (a temperature at which the half-life period is one hour) of 90 to 135° C., preferably 100 to 130° C., is preferably used in view of the high-speed crosslinking of the encapsulating material. The use of the aforementioned dialkyl peroxide provides the advantage of a blister phenomenon not taking place readily during encapsulation processing. On the other hand, the use of alkyl peroxyester or peroxyketal having the properties as described above provides the advantage of making it possible to further increase crosslinking speed but tends to cause a blister phenomenon, and therefore it may become necessary in this case to set the temperature at the time of crosslinking to a little lower level. Even in this case, it is possible to achieve an adequate crosslinking speed.

As an especially preferable embodiment of the present invention, a method in which (A) at least one kind of dialkyl peroxide and (B) at least one kind selected from between alkyl peroxyester and peroxyketal are mixed at an appropriate ratio can be cited. In this case, as the alkyl peroxyester of (B), alkyl peroxycarbonate is preferably used. This makes it possible to obtain an encapsulating material which enables high crosslinking speed to be achieved and a blister phenomenon to be suppressed. The ratio in use of the dialkyl peroxide and the organic peroxide selected from alkyl peroxyester and peroxyketal is 0.05 to 5 parts by weight, preferably 0.1 to 3 parts by weight of the former to 0.05 to 5 parts by weight, preferably 0.1 to 3 parts by weight of the latter.

When the organic peroxides (A) and (B) are impregnated into the molded form of the ethylene copolymer, both of them can be impregnated consecutively or simultaneously. And the simultaneous impregnation of the mixture of both is preferable. The impregnation of the organic peroxide can be carried out by coating or spraying the organic peroxide in a liquid state onto the surface of the molded form or immersing the molded form in the organic peroxide in a liquid state. Industrially, a method in which the organic peroxide in a liquid state is coated or sprayed onto the surface of the molded form is advantageous. Consequently, organic peroxides that are in a liquid state at normal temperature are preferably used for both of organic peroxides (A) and (B). However even if organic peroxide (A) is a solid in normal temperature, it may be used without any problem when organic peroxide (B) is in a liquid state at normal temperature and a mixture of organic peroxides (A) and (B) is in a liquid state at normal temperature. In the case when a mixture of organic peroxides (A) and (B) is used, the ratio (A)/(B) (by weight) in use between organic peroxides (A) and (B) is not limited particularly, but is preferably varied in the range of particularly 10/90 to 90/10. However, in view of crosslinking speed and dispersion speed in the molded form, a higher use ratio of organic peroxide (B) is preferable within the range that blister phenomenon is prevented. The most preferable (A)/(B) (by weight) is 10/90 to 80/20. The impregnation amounts of organic peroxides (A) and (B) vary according to their types, but the total content of (A) and (B) is effectively 0.1 to 5 parts by weight, particularly 0.5 to 3 parts by weight, based on 100 parts by weight of the ethylene polymer.

Even after the organic peroxide has been impregnated into the molded form by carrying out the operations as described above and the surface of the molded form has become dry, the molded form is preferably subjected to aging for not less than one day, preferably not less than 3 days, prior to the production of a solar cell module so that the organic peroxide is dispersed uniformly in the molded form. The aging is suitably carried out at normal temperature but may be carried out at raised temperature.

The impregnation of the organic peroxide or a mixture of the organic peroxide and the crosslinking aid into the molded form of the ethylene copolymer to which a crosslinking aid has been or has not been compounded can be carried out by coating or spraying an organic peroxide in a liquid state or a mixture of the organic peroxide and a crosslinking aid onto the surface of the molded form or immersing the molded form in the organic peroxide in a liquid state or a mixture of the organic peroxide and a crosslinking aid. Industrially, a method in which the organic peroxide in a liquid state or the mixture of the organic peroxide and the crosslinking aid is coated or sprayed onto the surface of the molded form is advantageous.

In the present invention, even after the organic peroxide has been impregnated into the molded form by carrying out the operations as described above and the surface of the molded form has become dry, the molded form is preferably subjected to aging for not less than one day, preferably not less than 3 days, prior to the production of the solar cell module so that the organic peroxide is dispersed uniformly in the molded form. The aging is suitably carried out at normal temperature but may be carried out at raised temperature.

Other various additives may be added to the encapsulating material for solar cell of the present invention as required. Specific examples of such additives include crosslinking auxiliaries, silane coupling agents, UV absorbers, antioxidants based on hindered phenol or phosphite, light stabilizers based on hindered amine, light scattering agents, flame retardants and discoloration prevention agents.

Silane coupling agent is useful to improve adhesive property for protection materials or a solar battery element. And, as the example, a compound having an unsaturated group such as vinyl group, acryloxy group and methacryloxy group, or a group which can be hydrolyzed such as alkoxy group, amino group and epoxy group can be cited.

The specific examples of silane coupling agent include N-(β-aminoethyl)-γ-aminopropyl trimethoxysilane, N-(β-aminoethyl)-γ-amino propylmethyl dimethoxysilane, γ-aminopropyl triethoxysilane, γ-glycidoxypropyl trimethoxysilane and γ-methacryloxypropyltrimethoxysilane.

It is desirable for silane coupling agent to combine approximate 0.1 to 5 parts by weight to 100 parts by weight of the ethylene copolymer (a).

As the ultraviolet absorption agent which can be added in solar battery encapsulating materials of the present invention, various types of absorption agent such as a benzophenone type, a benztriazole type, triazine-type and salicylic acid ester type can be cited. As benzophenone type of ultraviolet absorption agent, for example, 2-hydroxy-4-methoxy benzophenone, 2-hydroxy-4-methoxy-2'-carboxy benzophenone, 2-hydroxy-4-octoxy benzophenone, 2-hydroxy-4-n-dodecyl oxy benzophenone, 2-hydroxy-4-n-octadecyl oxy benzophenone, 2-hydroxy-4-benzil oxy benzophenone, 2-hydroxy-4-methoxy-5-sulfo benzophenone, 2-hydroxy-5-chlorobenzophenon, 2,4-dihydroxy benzophenone, 2,2'-dihydroxy-4-methoxy benzophenone, 2,2'-dihydroxy-4,4'-dimethoxy benzophenone and 2,2',4,4'-tetrahydroxy benzophenone etc. can be cited.

As benzotriazole type of ultraviolet absorption agent, being a hydroxy phenyl substitution benzotriazole compound, for example, and 2-(2-hydroxy-5-methyl phenyl) benzotriazole, 2-(2-hydroxy-5-t-butylphenyl) benzotriazole, 2-(2-hydroxy-3,5-dimethyl phenyl) benzotriazole, 2-(2-methyl-4-hydroxy phenyl) benzotriazole, 2-(2-hydroxy-3-methyl-5-t-butyl phenyl) benzotriazole, 2-(2-hydroxy-3,5-di-t-butyl phenyl) benzotriazole, 2-(2-hydroxy-3,5-dimethyl phenyl)-5-methoxy benzotriazole, 2-(2-hydroxy-3-t-butyl-5-methyl phenyl)-5-chlorobenzotriazole and 2-(2-hydroxy-5-t-butyl phenyl)-5-chlorobenzotriazole etc. can be cited.

In addition, as triazine-type ultraviolet absorption agent, 2-[4,6-bis(2,4-dimethyl phenyl)-1,3,5-triazine-2-yl]-5-(octyl oxy) phenol, 2-(4,6-diphenyl-1,3,5-triazine-2-yl)-5-(hexyl oxy) phenol etc. can be cited. As salicylic acid ester type, phenyl salicylate, p-octyl phenyl salicylate etc. can be cited.

These additives may be added to the ethylene copolymer by dry blending or melting-blending to the molded form of the ethylene copolymer prior to the impregnation with the organic peroxide. These additives may also be impregnated into the molded form of the ethylene copolymer which has been molded in an required shape together with the organic peroxide when the organic peroxide impregnates the molded form of the ethylene copolymer.

A solar cell module can be produced by fixing a solar cell element with top and bottom protective materials and by using the encapsulating material of the present invention obtained by that an organic peroxide impregnates the molded form of an intended shape. Various types can be cited as examples of such solar cell module. For example, examples of such solar cell module include solar cell modules of such structure that the solar cell element is sandwiched with protective materials from both sides of the solar cell element, such as the top transparent protective material/encapsulating material/solar cell element/encapsulating material/bottom protective material structure; solar cell modules of such structure that an encapsulating material and the top transparent protective material are mounted on a solar cell element formed on the inner circumference of the bottom substrate protective material; and solar cell modules of such structure that an encapsulating material and the bottom protective material are mounted on a solar cell element formed on the inner circumference of the top transparent protective material, such as an amorphous solar cell element formed by sputtering or other method on a fluororesin-type transparent protective material.

For the solar cell element, various solar cell elements can be used, including solar cell elements based on silicon such as single-crystal silicon, polycrystal silicon and amorphous silicon, and solar cell elements based on Group III-V and II-VI compound semiconductors such as gallium-arsenic, copper-indium-selenium and cadmium-tellurium.

Examples of the top protective material making up a solar cell module include glass, acrylic resin, polycarbonate, polyester and fluorine-containing resin. The bottom protective material is metal or a single- or multi-layer sheet such as film of various thermoplastic resin, and examples of the bottom protective material include metals such as tin, aluminum and stainless steel, inorganic materials such as glass and single- or multi-layer protective materials of polyester, inorganic material-metallized polyester, fluorine-containing resin and polyolefin. The solar cell encapsulating material of the present invention shows satisfactory adhesion with these top and bottom protective materials.

The production of a solar cell module has only to be carried out by preliminarily bonding the aforementioned encapsulating material to the solar cell element and the protective materials at a temperature at which the organic peroxide is not decomposed and the aforementioned encapsulating material is melted and then carrying out adequate bonding and the crosslinking of the encapsulating material after raising the temperature. The bonding and crosslinking temperature is a temperature at which satisfactory crosslinking speed is achieved and blistering does not occur and is preferably within a range of approximately 100 to 180° C., for example. The ethylene copolymer is crosslinked preferably in such manner that the gel content (determined as mass percentage of unmelted content obtained by filtering the test mixture after one gram (1 g) of sample was immersed in 100 ml of xylene and heated at 110° C. for 24 hours) is preferably 70% to 98%, especially preferably 80% to 95%, so that a solar cell module having satisfactory heat resistance is finally obtained. Therefore, an additive formulation that meet these conditions has only to be selected. For example, the kinds and contents of the organic peroxide and other additives of the present invention have only to be selected.

EXAMPLES

Given below is a detailed explanation of the present invention using Examples. Further, the raw materials and evaluation methods used in the Examples and Comparative Examples are as follows:

1. Raw materials
   (1) EVA: Ethylene-vinyl acetate copolymer (vinyl acetate content: 28 wt %; MFR: 15 g/10 min.)
   (2) Organic peroxide A: 2,5-dimethyl-2,5-bis(tertiary butylperoxy)hexane, product name: Lupazol 101, available from Atochem Yoshitomi Ltd., temperature at which the half-life period is one hour: 140° C.
   (3) Organic peroxide B: Tertiary butylperoxy-2-ethylhexylcarbonate, product name: Lupazol TBEC, available from Atochem Yoshitomi Ltd., temperature at which the half-life period is one hour: 121° C.
   (4) Crosslinking aid: Triallylisocyanurate (TAIC)
   (5) Silane coupling agent: γ-methacryloxypropyl trimethoxy silane, product name: KBM 503, available from Shin-Etsu Chemical Co., Ltd.
2. Evaluation Methods
   (1) Blister Properties A sheet sample 0.5 mm in thickness was sandwiched with two sheets of polyethylene terephthalate film (100 μm). They were laminated at the temperature of 150° C. in 5 minutes by use of a vacuum laminator and cured in an oven at 150° C. for one hour. After that, the condition (occurrence of air bubbles) of the crosslinked sheet was observed and evaluated.

(2) Crosslinking Speed

A sheet sample was cut into granular samples, and the torque was read at 150° C. after 10 minutes by use of MDR (torque flat plate die vulcanization tester). The test results indicate that as torque becomes higher, the degree of crosslinking advances.

(3) Impregnation Speed of the Organic Peroxide

A inflation film 100 μm in thickness was produced from the aforementioned EVA and taken up on a roll. A sample comprising a stack of 6 sheets of the film was prepared from the roll of the film, and the organic peroxide was coated on one side of the stack to 6.8 g/m². After one week, the first, third and fifth sheets of the film from the top were peeled off. The organic peroxide concentration of each of them was measured by gas chromatography, and the degree of the dispersion of the organic peroxide was evaluated.

Example 1

5,000 g of the aforementioned EVA pellets, 100 g of the crosslinking aid TAIC and 25 g of the silane coupling agent were mixed and allowed to stand for a whole day for the purpose of impregnation. From the impregnated pellets thus obtained, a sheet 0.5 mm in thickness was prepared by means of 40-mmφ sheet molding machine. After 1.5 g of organic peroxide A in a liquid state per 100 g of this sheet were coated onto the sheet uniformly by means of a bar coater, the sheet was subjected to aging for 2 weeks. The sheet sample thus obtained was used for the purpose of evaluating blister properties and crosslinking speed. Results are shown in Table 1.

Example 2

An evaluation was carried out in the same manner as in Example 1 except that a mixed solution of organic peroxide A and organic peroxide B mixed at a ratio of 2:8 was used in place of organic peroxide A in a liquid state. Results are shown in Table 1.

Comparative Example 1

An evaluation was carried out in the same manner as in Example 1 except that a sheet was prepared without using the crosslinking aid TAIC. Results are shown in Table 1.

Comparative Example 2

An evaluation was carried out in the same manner as in Comparative Example 1 except that organic peroxide B was used in place of organic peroxide A. Results are shown in Table 1.

Reference Example

In Example 2, a sheet was prepared by mixing a mixed solution of organic peroxide A and organic peroxide B mixed at a ratio of 2:8 was used together with the crosslinking aid, the silane coupling agent and the pellets by means of 40-mmϕ sheet molding machine. Results are shown in Table 1.

TABLE 1

| | Example 1 | Example 2 | Comparative Example 1 | Comparative Example 2 | Reference Example |
|---|---|---|---|---|---|
| Type of organic peroxide | A | A/B = 2/8 | A | B | A |
| Use of cross-linking aid | Yes | Yes | No | No | Yes |
| Blister | No | No | No | Yes | No |
| MDR torque | 4 | 4.5 | 1.5 | 3.5 | 4 |

The results of Table 1 indicate that the crosslinking speed of the sample of Example 1 is significantly improved compared to Comparative Example 1. Further, a comparison of Example 2 and Comparative Example 2 shows that the use of both the crosslinking aid and a small amount of organic peroxide A improved crosslinking speed and additionally resolved a blister phenomenon occurred in using of organic peroxide B.

Example 3

5,000 g of the aforementioned EVA pellets and 25 g of the silane coupling agent were mixed and allowed to stand for a whole day for the purpose of impregnation. From the impregnated pellets thus obtained, a sheet 0.5 mm in thickness was obtained by means of 40-mmϕ sheet molding machine. After 1.5 g of a mixed solution of organic peroxide A and organic peroxide B mixed at a ratio of 2:8 per 100 g of this sheet were coated onto the sheet uniformly by means of a bar coater, the sheet was subjected to aging for 2 weeks. The blister properties and crosslinking speed of the sheet sample thus obtained were evaluated. In addition, a sheet of inflation film 100 μm in thickness was molded from the above EVA, and the impregnation speed of the organic peroxide was evaluated by using a mixed solution of organic peroxide A and organic peroxide B mixed at a ratio of 2:8. Results are shown in Table 2.

Comparative Example 3

An evaluation was carried out in the same manner as in Example 3 except that organic peroxide B in a liquid state was used in place of a mixed solution of organic peroxide A and organic peroxide B mixed at a ratio of 2:8. Results are shown in Table 2.

Comparative Example 4

An evaluation was carried out in the same manner as in Example 3 except that organic peroxide A in a liquid sate was used in place of a mixed solution of organic peroxide A and organic peroxide B mixed at a ratio of 2:8. Results are shown in Table 2.

TABLE 2

| | Example 3 | Comparative Example 3 | Comparative Example 4 |
|---|---|---|---|
| Type of organic peroxide | A/B = 2/8 | B | A |
| Blister | No | Yes | No |
| MDR torque | 3.2 | 3.8 | 1.4 |
| Ratio of organic peroxide concentrations among 1st, 3rd and 5th film sheets | 1:0.9:0.8 | 1:1:1 | 4:3:2 |

The results of Table 2 indicate that the sample of Example 3 showed allowable high dispersion and crosslinking speed of the organic peroxide same as in the case of using organic peroxide B, while on the other hand resolving a blister phenomenon that is accrued in using of organic peroxide B.

POSSIBILITY OF INDUSTRIAL USE

The present invention provides a process for producing solar cell encapsulating materials which makes high-speed crosslinking possible and causes no blister phenomenon without significant restrictions being imposed on the conditions for molding the encapsulating material.

The method that is provided by the present invention is a method that allows solar cell encapsulating materials of uniform quality to be produced effectively.

Since the present invention allows a broad range of temperature to be selected in the molding of encapsulating materials, the present invention provides a solar cell encapsulating material manufacturing method that makes it possible both to increase molding speed and to conduct precise molding.

In addition, since the molded form of the ethylene copolymer used in the encapsulating material for solar cell manufacturing method of the present invention can be obtained by the injection molding and press molding ablister as extrusion, the molded form can be applied to the manufacture of encapsulating materials not only in the form of sheet but also in a complex shape.

Furthermore, since high-speed crosslinking is possible even in the case of using an organic peroxide showing a relatively high decomposition temperature, the present invention makes it easy to prevent the blistering of the encapsulating material during crosslinking and makes it possible to form an encapsulation layer having a high percent gel content.

Moreover, in the process for producing the encapsulating material for solar cell of the present invention, the case of using two or more kinds of organic peroxides having different decomposition temperatures, it is possible to further increase crosslinking speed and suppress a blister phenomenon by setting their blending ratio within an appropriate range.

Furthermore, in the process for producing the encapsulating material for solar cell of the present invention, since a blister phenomenon can be suppressed all the more without high-speed crosslinkability being impaired too much even if crosslinking temperature is lowered, the present invention is applicable satisfactorily to the production of those solar cell modules using plastic protective materials.

The invention claimed is:

1. A process for producing a solar cell module, comprising:
producing an encapsulating material by a process comprising impregnating a molded form of a copolymer of ethylene and a polar monomer with a mixture of an organic peroxide and a crosslinking aid blended at a ratio by weight of 1/0.1 to 0.1/1, wherein the organic peroxide is in a liquid state at room temperature which shows a decomposition temperature (a temperature at which the half-life period is one hour) of not higher than 150° C.,
wherein the organic peroxide comprises a dialkyl peroxide (A), and an organic peroxide (B) that is selected from the group consisting of peroxycarbonate and peroxyketal, at a ratio by weight of 10/90 to 90/10 of (A) and (B), and
wherein after the mixture of the organic peroxide and the crosslinking aid is impregnated into the molded form of the copolymer of ethylene and the polar monomer, the molded form is subjected to aging for not less than three days;
providing a solar cell element and at least one protective material; and
encapsulating the solar cell element and the at least one protective material with the encapsulating material.

2. The process for producing the solar cell module according to claim 1, wherein the molded form of a copolymer of ethylene and a polar monomer is a molded form of a copolymer of ethylene and a polar monomer containing a crosslinking aid.

3. The process for producing the solar cell module according to claim 1, wherein the molded form of a copolymer of ethylene and a polar monomer is a molded form of a copolymer of ethylene and a polar monomer not containing any crosslinking aid.

4. The process for producing the solar cell module according to claim 1, wherein the surface of the molded form of a copolymer of ethylene and a polar monomer is coated or sprayed with the aforementioned organic peroxide and the organic peroxide is impregnated into the molded form.

5. The process for producing the solar cell module according to claim 1, wherein the molded form is a sheet.

6. The process for producing the solar cell module according to claim 1, wherein the copolymer of ethylene and a polar monomer is at least one kind of copolymer selected from the group consisting of ethylene-vinylester copolymer, ethylene/unsaturated carboxylic acid ester copolymer, ethylene/unsaturated carboxylic acid copolymer and its ionomer.

* * * * *